(12) United States Patent
Johnson

(10) Patent No.: US 6,778,117 B1
(45) Date of Patent: Aug. 17, 2004

(54) LOCAL OSCILLATOR AND MIXER FOR A RADIO FREQUENCY RECEIVER AND RELATED METHOD

(75) Inventor: Richard A. Johnson, Buda, TX (US)

(73) Assignee: Silicon Laboratories, Inc., Austin, TX (US)

( * ) Notice: Subject to any disclaimer, the term of this patent is extended or adjusted under 35 U.S.C. 154(b) by 21 days.

(21) Appl. No.: 10/375,967

(22) Filed: Feb. 28, 2003

(51) Int. Cl.[7] .............................................. H03M 1/66
(52) U.S. Cl. ........................................ 341/144; 341/118
(58) Field of Search ................................ 341/144, 145, 341/136, 118; 330/253, 269; 375/376, 362

(56) References Cited

U.S. PATENT DOCUMENTS

| | | | |
|---|---|---|---|
| 4,866,261 A | * | 9/1989 | Pace .......................... 341/138 |
| 5,442,352 A | | 8/1995 | Jackson |
| 5,495,512 A | * | 2/1996 | Kovacs et al. .............. 375/376 |
| 5,737,035 A | | 4/1998 | Rotzoll |
| 6,172,569 B1 | * | 1/2001 | McCall et al. .............. 330/303 |
| 6,177,964 B1 | | 1/2001 | Birleson et al. |
| 6,377,315 B1 | | 4/2002 | Carr et al. |
| 6,600,373 B1 | * | 7/2003 | Bailey et al. ............... 330/260 |
| 2003/0223525 A1 | * | 12/2003 | Momtaz et al. ............. 375/376 |

* cited by examiner

*Primary Examiner*—Brian Young
*Assistant Examiner*—John B Nguyen
(74) *Attorney, Agent, or Firm*—Toler, Larson & Abel, LLP

(57) ABSTRACT

A circuit (100) is adapted for use in a radio frequency receiver and includes a transconductance amplifier (110), a direct digital frequency synthesizer (130), and a digital-to-analog converter (DAC) (120). The transconductance amplifier (110) has an input terminal for receiving a radio frequency signal, and an output terminal for providing a current signal. The direct digital frequency synthesizer (130) has an output terminal for providing a digital local oscillator signal at a selected frequency. The DAC (120) has a first input terminal coupled to the output terminal of the transconductance amplifier (110), a second input terminal coupled to the output terminal of the direct digital frequency synthesizer (130), and an output terminal for providing an output signal.

26 Claims, 4 Drawing Sheets

LOCAL OSCILLATOR AND MIXER FOR A RADIO FREQUENCY RECEIVER AND RELATED METHOD

CROSS REFERENCE TO RELATED, COPENDING APPLICATION

Related subject matter is found in a copending patent application entitled "Tuner Suitable for Integration and Method for Tuning a Radio Frequency Signal," application number unknown, invented by Richard A. Johnson, filed of even date herewith and assigned to the assignee hereof.

FIELD OF THE INVENTION

The present invention relates generally to radio frequency signal receivers, and more particularly to mixers and related circuits for use in radio frequency receivers.

BACKGROUND OF THE INVENTION

Radio frequency (RF) receivers are used in a wide variety of applications such as television, cellular telephones, pagers, global positioning system (GPS) receivers, cable modems, cordless phones, and the like. RF receivers all require frequency translation or mixing. For example, a television receiver may translate one channel in the band of 48 MHz to 870 MHz to an intermediate frequency of 44 MHz.

The majority of today's RF receivers perform the necessary frequency translation or mixing using an oscillator and analog multiplier. FIG. 1 illustrates in schematic form a local oscillator and mixer circuit 60 known in the prior art that uses this technique. Circuit 60 includes an oscillator 62 and a mixer 64. Oscillator 62 forms local oscillator signal labeled "LO" in the form of a sine wave having a frequency of $f_{LO}$. Mixer 64 mixes the RF input signal having desired spectral content at $f_{IN}$ with the local oscillator signal to form an output voltage signal labeled "$V_{OUT}$" having spectral content at frequencies equal to the sum and difference of the input frequencies, namely $f_{IN}+f_{LO}$ and $f_{IN}-f_{LO}$.

Mathematically, the RF input signal can be expressed as:

$$RF = A_{IN}(\cos \omega_{IN} t) \quad [1]$$

where $A_{IN}$ is the amplitude of the RF input signal, and $\omega_{IN}$ is the radian frequency. Similarly the local oscillator signal can be expressed as:

$$LO = A_{LO}(\cos \omega_{LO} t) \quad [2]$$

where $A_{LO}$ is the amplitude of the local oscillator signal, and $\omega_{LO}$ is the radian frequency. The product formed at the output of the mixer can be expressed as:

$$V_{OUT} = [A_{IN}(\cos \omega_{IN} t)][A_{LO}(\cos \omega_{LO} t)] \quad [3]$$
$$= \frac{A_{IN} A_{LO}}{2}[\cos(\omega_{IN} - \omega_{LO})t + \cos(\omega_{IN} + \omega_{LO})t]$$

One of these components forms the channel spectrum translated to the desired frequency and the other component can be filtered out. Oscillator 62 can be implemented by a tuned inductor-capacitor (LC) oscillator, a charge relaxation oscillator, or a ring oscillator.

An alternative is shown in FIG. 2, which illustrates in partial block diagram and partial schematic form another local oscillator and mixer circuit 80 known in the prior art. In circuit 80 a digitally synthesized oscillator 82, also known as a direct digital frequency synthesizer (DDFS), is used to generate the LO signal. The output of DDFS 82 is converted into an analog signal using a digital-to-analog converter (DAC) 84 for input to a mixer 86. This technique of generating the local oscillator signal has several advantages compared to the analog oscillator used in FIG. 1, including wide tuning range, high noise immunity, minimal self-mixing, and minimal leakage. However the Nyquist criterion that forces DDFS 82 to be clocked at greater than twice the highest oscillation frequency has so far limited its use to low-frequency applications.

It would be desirable to have circuitry for use in an RF receiver that is suitable for higher frequency applications. Such circuitry and related methods are provided by the present invention, whose features and characteristics will become apparent from the subsequent detailed description of the invention and the appended claims, taken in conjunction with the accompanying drawings and this background of the invention.

BRIEF SUMMARY OF THE INVENTION

Accordingly the present invention provides, in one form, a circuit adapted for use in a frequency receiver. The circuit includes a transconductance amplifier, a direct digital frequency synthesizer, and a digital-to-analog converter (DAC). The transconductance amplifier has an input terminal for receiving a radio frequency signal, and an output terminal for providing a current signal. The direct digital frequency synthesizer has an output terminal for providing a digital local oscillator signal at a selected frequency. The DAC has a first input terminal coupled to the output terminal of the transconductance amplifier, a second input terminal coupled to the output terminal of the direct digital frequency synthesizer, and an output terminal for providing an output signal.

In another form, the present invention provides a method for use in a radio frequency receiver. A radio frequency signal is received and converted into a current signal. A digital local oscillator signal is generated and is mixed with the current signal to form an analog output signal.

BRIEF DESCRIPTION OF THE DRAWINGS

The present invention will hereinafter be described in conjunction with the following drawing figures, wherein like numerals denote like elements.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the drawings.

Figure 1:
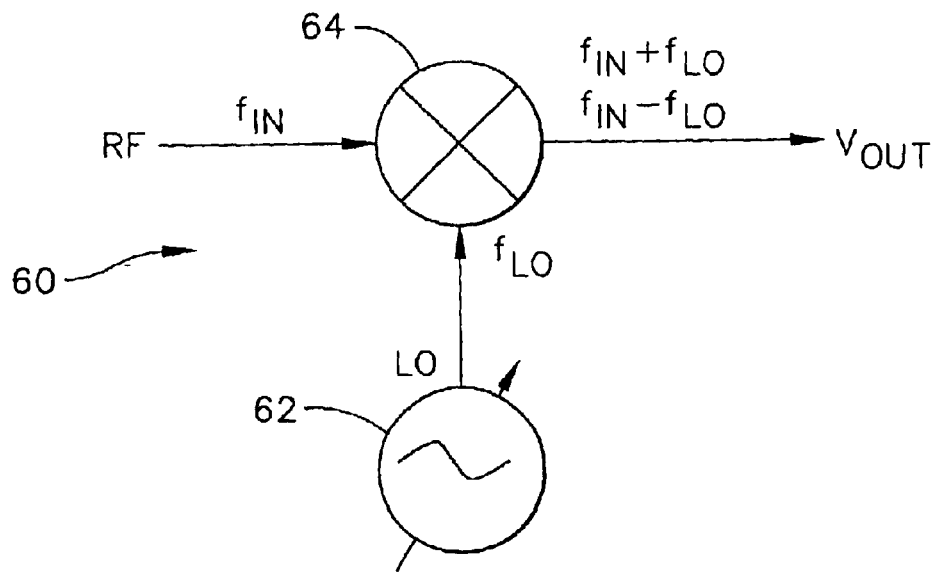
FIG. 1 illustrates in schematic form a local oscillator and mixer circuit known in the prior art.
Figure 2:
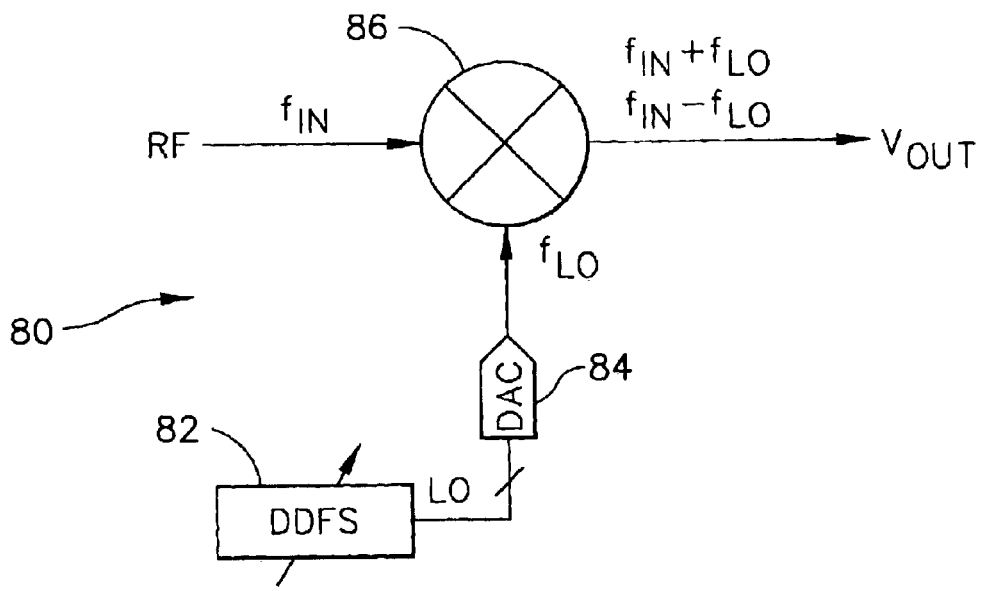
FIG. 2 illustrates in partial block diagram and partial schematic form another local oscillator and mixer circuit known in the prior art.
Figure 3:
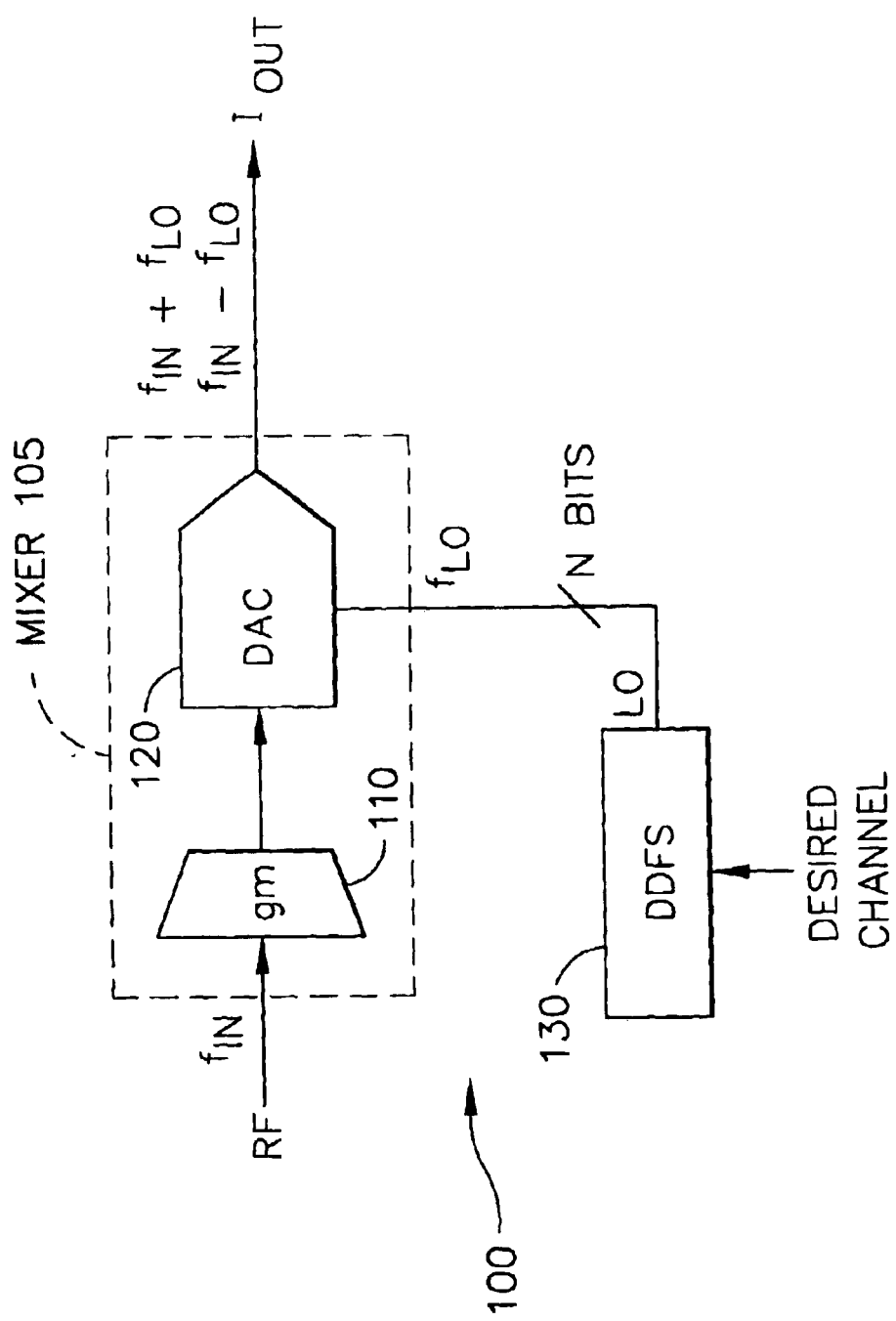
FIG. 3 illustrates in partial block diagram and partial schematic form a local oscillator and mixer circuit according to the present invention.

FIG. 3 illustrates in partial block diagram and partial schematic form a local oscillator and mixer circuit 100 according to the present invention. Circuit 100 includes a transconductance amplifier 110, a current multiplying DAC 120, and a DDFS 130. Transconductance amplifier 110 has an input terminal for receiving a radio frequency signal labeled "RF", and an output terminal for providing a current signal, and has an associated transconductance labeled "gm". As used herein, "radio frequency signal" means an electrical signal conveying useful information and having a frequency from about 3 kilohertz (kHz) to thousands of gigahertz (GHz), regardless of the medium through which such signal is conveyed. Thus an RF signal may be transmitted through air, free space, coaxial cable, fiber optic cable, etc., Signal RF has desired spectral content centered at a frequency $f_{IN}$. Current multiplying DAC 120 has a first input terminal connected to the output terminal of transconductance amplifier 110, a second input terminal, and an output terminal for providing an output signal labeled "$I_{out}$". DDFS 130 has an input terminal for receiving a tuning signal corresponding to a DESIRED CHANNEL, and an output terminal connected to the second input terminal of current multiplying DAC 120 for providing a digital local oscillator signal labeled "LO" represented by N bits. LO is a digital representation of voltages of a sine wave having a frequency $f_{LO}$.

In basic operation, transconductance amplifier 110 converts the RF signal from a voltage signal into a current signal. DAC 120 is a current multiplying DAC that receives the current signal at the output of transconductance amplifier 110, mixes it bit-by-bit with the N-bit mixing signal from DDFS 130, and sums the output current components to form $I_{OUT}$. As a result of the mixing operation $I_{OUT}$ moves the spectral content of RF to sum and difference frequencies, namely $f_{IN}+f_{LO}$ and $f_{IN}-f_{LO}$. DDFS 130 provides signal LO at a frequency chosen to mix the DESIRED CHANNEL to another frequency of interest, such as baseband or a suitable intermediate frequency (IF). Current multiplying DAC 120 includes multiple mixing cells each weighted according to the order of the cell.

Figure 4:
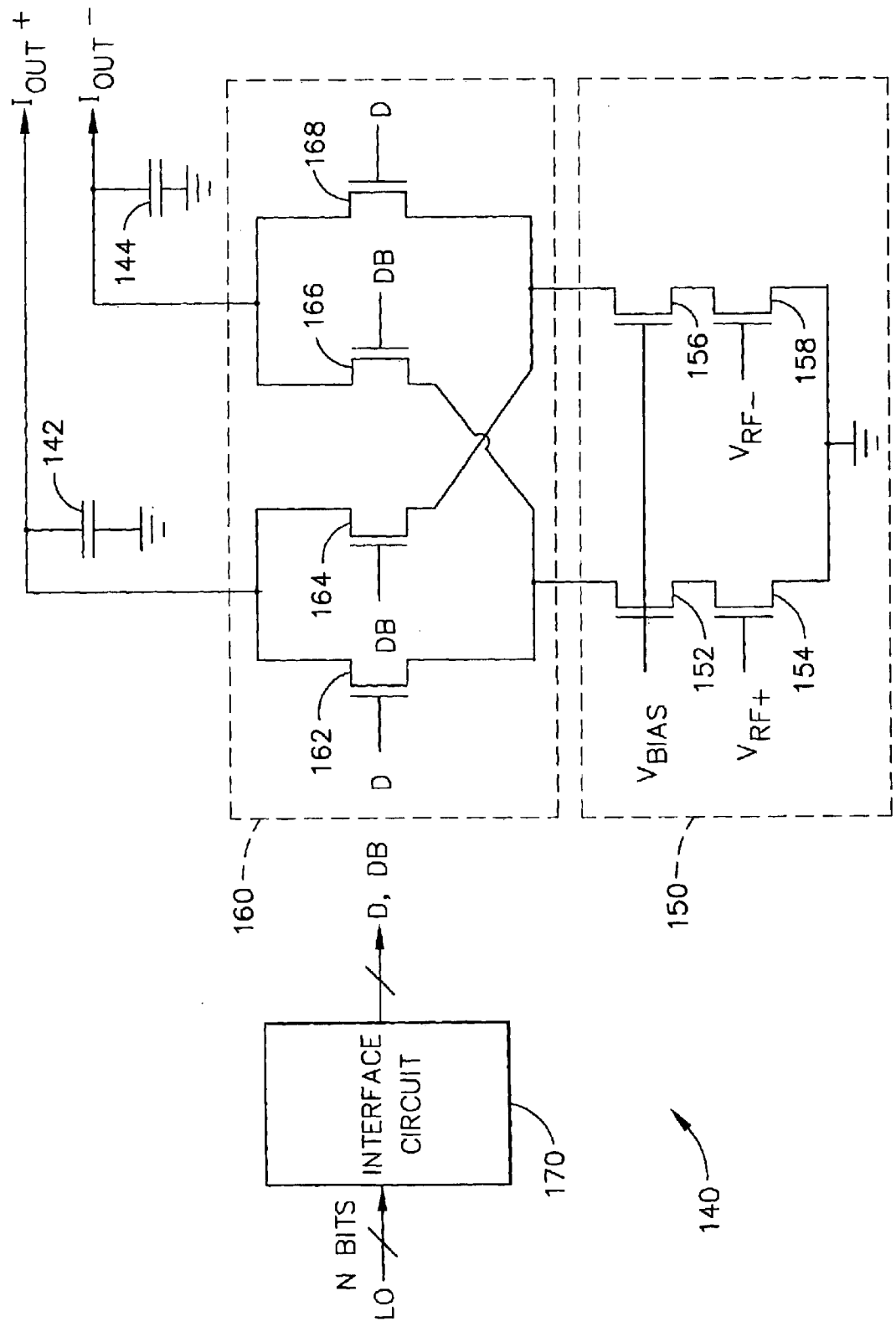
FIG. 4 illustrates in schematic form a circuit implementation of one cell of the mixer circuit of FIG. 3.

FIG. 4 illustrates in schematic form a circuit implementation of one cell 140 of mixer circuit 105 of FIG. 3. Cell 140 includes generally a current cell 150 of transconductance amplifier 110 and a converter cell 160 of DAC 120. Also shown in FIG. 3 are an interface circuit 170 of DAC 120, a load capacitor 142, and a load capacitor 144. Current cell 150 includes N-channel metal-oxide-semiconductor (MOS) transistors 152, 154, 156, and 158. Transistor 152 has a drain, a gate for receiving a bias voltage labeled "$V_{BIAS}$", and a source. Transistor 154 has a drain connected to the source of transistor 152, a gate for receiving a signal labeled "$V_{RF+}$", and a source connected to a ground power supply voltage terminal. Transistor 156 has a drain, a gate for receiving bias voltage $V_{BIAS}$, and a source. Transistor 158 has a drain connected to the source of transistor 156, a gate for receiving a signal labeled "$V_{RF-}$", and a source connected to the ground power supply voltage terminal.

Converter cell 160 includes transistors 162, 164, 166, and 168. Transistor 162 has a drain for providing signal $I_{OUT}^+$, a gate for receiving a true data signal labeled "D", and a source connected to the drain of transistor 132. Transistor 164 has a drain connected to the drain of transistor 162, a gate for receiving a complementary data signal labeled "DB", and a source connected to the drain of transistor 156. Transistor 166 has a drain for providing signal $I_{out-}$, a gate for receiving signal DB, and a source connected to the drain of transistor 152. Transistor 168 has a drain connected to the drain of transistor 166, a gate for receiving signal D, and a source connected to the drain of transistor 156.

Interface circuit 170 is shared between all current cells in DAC 120 and has an input terminal for receiving the N-bit LO signal from DDFS 130, and an output terminal for providing a multiple bit output signal labeled "D, DB". D and DB are true and complement digital signals, respectively, of a digital signal pair corresponding to certain values of the N-bit LO signal as will be described further below, and interface circuit provides one pair for each converter cell.

Capacitor 142 has a first terminal connected to the drains of transistors 162 and 164, and a second terminal connected to the ground power supply voltage terminal. Capacitor 144 has a first terminal connected to the drains of transistors 166 and 168, and a second terminal connected to the ground power supply voltage terminal. Capacitors 142 and 144 serve as filter capacitors and are shared between all cells.

The RF input signal is represented as a differential voltage signal between $V_{RF+}$ and $V_{RF-}$. $V_{BIAS}$ is a bias voltage selected to keep transistors 154 and 158 operating in the triode (linear) region of their voltage-current characteristic. Thus as $V_{RF+}$ and $V_{RF-}$ vary, they modulate the voltage at the sources of transistors 152 and 156, forming a differential current signal on the drains of transistors 132 and 136. The bits of the digital local oscillator signal LO cause transistors 162, 164, 166, and 168 to switch the current of current cell 150 from side to side. These currents are switched at the output speed of DDFS 130, $f_{CLOCK}$, which is constrained by Nyquist's theorem to be greater than twice the maximum $f_{LO}$.

The resolution (and hence the number of bits) required by DAC 120 can be determined by considering the worst-case energy in the undesired channels, since quantization noise will be mixed by the undesired channels into the desired band at the output of the mixer. A terrestrial television receiver may need to tune a relatively-weak desired channel when the receiver is close to the transmitter of a relatively-strong undesired channel. For example assume the desired channel has a signal strength of −83 dBm (where dBm represents a decibel power level with reference to a power level of 1 milliwatt dissipated across a 75 ohm load), an undesired channel has a signal strength of −15 dBm, and the minimum signal to noise ratio (SNR) required at the output of the mixer is 15 dB. The integrated quantization noise for the LO signal in a 6 MHz band for a 10-bit DAC clocked at 2 gigahertz (2 GHz) is −84 dBc (decibel level with respect to carrier frequency $f_{LO}$). This quantization noise appears in every 6 MHz band from DC to $f_{CLOCK}/2$(1 GHz) and is mixed by the −15 dBm undesired channel into the desired channel's band at a −99 dBm level (−15 dBm+(−84 dBc)). The resulting SNR is thus −83 dBm—(−99 dBm)=16 dB, which is greater than the minimum required SNR of 15 dB. Thus a 10-bit DAC yields barely acceptable results while a 9-bit DAC would not.

The switching speed of the DAC, which determines the maximum $f_{LO}$ which can be created because the clock of the DAC must be greater than twice the maximum $f_{LO}$, is determined by the on resistance of transistors 162, 164, 166, and 168 in FIG. 4 and the parasitic capacitances at the sources of the switches. There is a practical speed limit for this structure in a given technology because as the switch resistance is decreased the parasitic capacitance increases. However the practical speed limit is in the range of several GHz for existing integrated circuit technologies, which makes the DDFS/mixer combination suitable for a broad variety of radio frequency receiver applications.

Interface circuit 170 converts the N-bit LO signal into pairs of true and complementary bits so that converter cell 160 can switch the currents differentially. In one embodiment, each of the D and DB signals as well as the current and converter cells are binarily weighted; thus the most significant bit pairs switch currents that are twice the currents switched by the second most significant bit pairs, the second most significant bit pairs switch currents that are twice the currents switched by the third most significant bit pairs, and so on. In this case interface circuit 170 provides 2N output signals consisting of N pairs of D and DB signals.

Preferably to achieve better performance, however, the less significant bits are binarily weighted as just described while the more significant bits are thermometer encoded. In a thermometer encoding scheme, the binary values will be switched using a corresponding number of equally-weighted currents. Thus M thermometer encoded bits switch $2^M-1$ equally-weighted current cells. The number of most significant bits that are thermometer encoded will vary depending on the desired performance, and the number of output pairs generated by interface circuit 170 will also vary accordingly.

The output signal is also preferably a differential signal formed between $I_{OUT+}$ and $I_{OUT-}$. In an alternative embodiment, however, if the drains of transistors 166 and 168 were connected to a reference voltage terminal, such as an analog ground terminal, the drains of transistors 162 and 164 would form a single-ended output signal.

Figure 5:
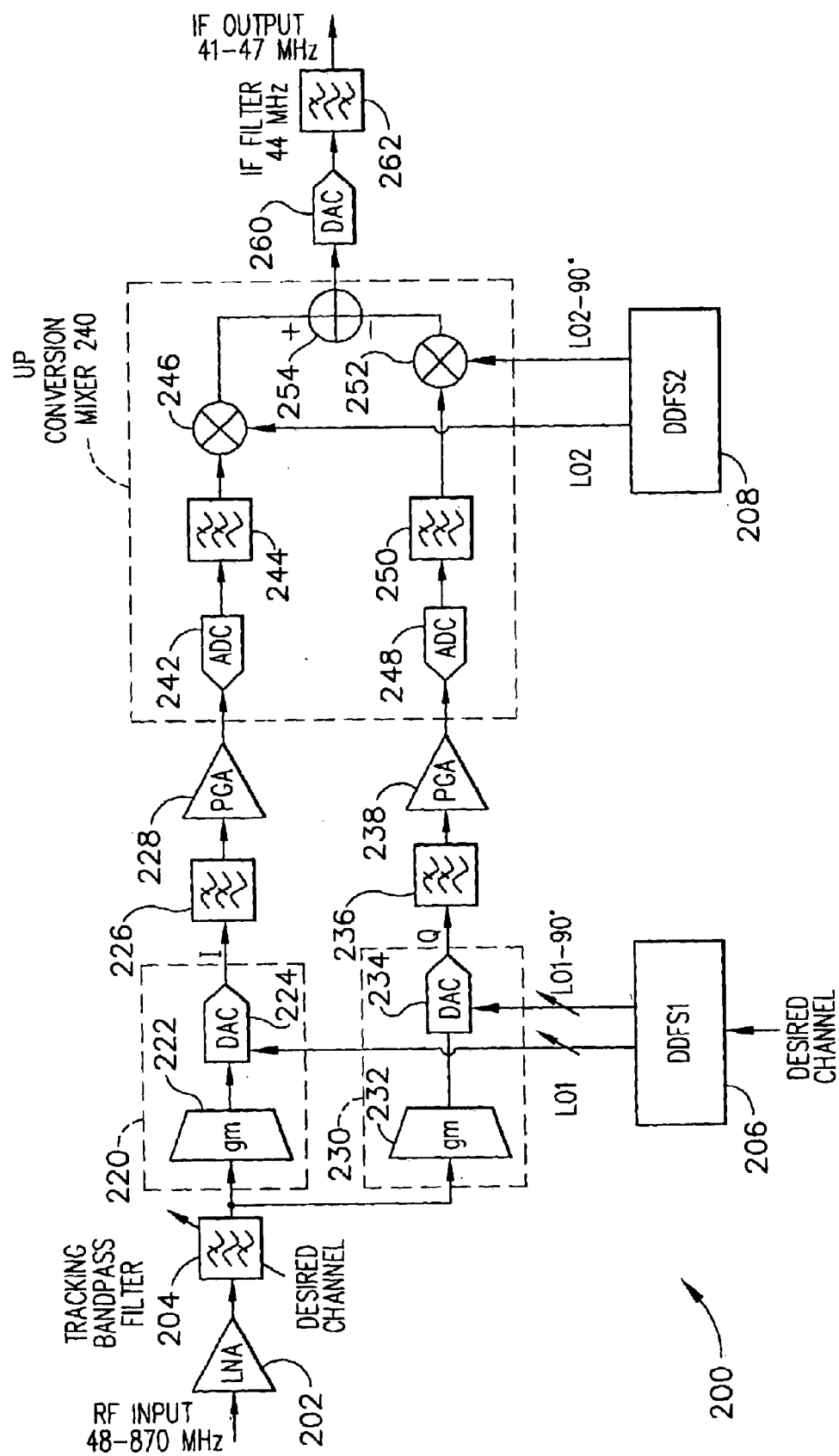
FIG. 5 illustrates in partial block diagram and partial schematic form an integrated television tuner that advantageously uses the circuitry of FIGS. 3 and 4.

FIG. 5 illustrates in partial block diagram and partial schematic form an integrated television tuner 200 that advantageously uses the circuitry of FIGS. 3 and 4. Tuner 200 includes generally an LNA 202, a tracking bandpass filter 204, a DDFS labeled "DDFS1" 206, a DDFS labeled "DDFS2" 208, a mixer 220, a lowpass filter 226, a PGA 228, a mixer 230, a lowpass filter 236, a PGA 238, an up conversion mixer 240, a DAC 260, and an IF filter 262. LNA 202 has an input terminal for receiving an input signal labeled "RF INPUT", and an output terminal. Tracking bandpass filter 204 has an input terminal connected to the output terminal of LNA 202, a tuning input terminal for receiving the DESIRED CHANNEL signal, and an output terminal. DDFS 206 has an input for receiving the DESIRED CHANNEL signal, and output terminals for providing digital local oscillator signals labeled "LO1" and "LO1–90°". DDFS 208 has output terminals for providing digital local oscillator signals labeled "LO2" and "LO2–90°".

Mixer 220 has a first input terminal connected to the output terminal of tracking bandpass filter 204, a second input terminal for receiving signal LO1, and an output terminal for providing an in-phase baseband signal labeled "I". Mixer 220 includes a transconductance amplifier 222 and a DAC 224. Transconductance amplifier 222 has an input terminal connected to the output terminal of filter 204, and an output terminal. DAC 224 has a first input terminal connected to the output terminal of transconductance amplifier 222, a second input terminal for receiving signal LO1, and an output terminal for providing signal 1. Filter 226 has an input terminal connected to the output terminal of mixer 220, and an output terminal. PGA 228 has an input terminal connected to the output terminal of filter 226, and an output terminal.

Mixer 230 has a first input terminal connected to the output terminal of tracking bandpass filter 204, a second input terminal for receiving signal LO1–90°, and an output terminal for providing a quadrature baseband signal labeled "Q". Mixer 230 includes a transconductance amplifier 232 and a DAC 234. Transconductance amplifier 232 has an input terminal connected to the output terminal of filter 204, and an output terminal. DAC 234 has a first input terminal connected to the output terminal of transconductance amplifier 232, a second input terminal for receiving signal LO1–90°, and an output terminal for providing signal Q. Filter 236 has an input terminal connected to the output terminal of mixer 230, and an output terminal. PGA 238 has an input terminal connected to the output terminal of filter 236, and an output terminal.

Up conversion mixer 240 includes an analog-to-digital converter (ADC) 242, a lowpass filter 244, a mixer246, an ADC 248, a lowpass filter 250, a mixer 252, and a summing device 254. ADC 242 has an input terminal connected to the output terminal of PGA 228, and an output terminal. Lowpass filter 244 has an input terminal connected to the output terminal of ADC 242, and an output terminal. Mixer 246 has a first input terminal connected to the output terminal of lowpass filter 244, a second input terminal for receiving signal LO2, and an output terminal. ADC 248 has an input terminal connected to the output terminal of PGA 238, and an output terminal. Lowpass filter 250 has an input terminal connected to the output terminal of ADC 248, and an output terminal. Mixer 252 has a first input terminal connected to the output terminal of lowpass filter 250, a second input terminal for receiving signal LO2–90°, and an output terminal. Summing device 254 has a positive input terminal connected to the output terminal of mixer 246, a negative input terminal connected to the output terminal of mixer 252, and an output terminal. DAC 260 has an input terminal connected to the output terminal of summing device 254, and an output terminal. IF filter 262 has an input terminal connected to the output terminal of DAC 260, and an output terminal for providing an output signal of tuner 200 labeled "IF OUTPUT".

In operation tuner 200 illustrates one example of an RF receiver in which the circuitry described in FIGS. 3 and 4 may be advantageously used. The RF INPUT signal is received from an antenna or cable source (not shown) and is provided to the input terminal of LNA 202. LNA 202 has a variable gain. The output of LNA 202 is input to tracking bandpass filter 204 whose center frequency is tunable based on the DESIRED CHANNEL input signal to reject undesired channels.

The tuned output signal, which includes the desired channel plus attenuated undesired channels, is mixed to baseband as follows. The output of filter 204 is converted into a current signal by highly linear transconductance amplifier 222. The current signal is then mixed in DAC 224, which functions as a current multiplying DAC using LO1 as a mixing signal, to provide the in-phase baseband signal I. Likewise the output of filter 204 is converted into a current signal by a separate highly linear transconductance amplifier 232, and is mixed in DAC 234 using a phase-shifted version of LO1, namely LO1–90°, as a mixing signal to develop the quadrature baseband signal Q. DDFS 206, transconductance amplifiers 222 and 232, and DACs 224 and 234 are implemented as described above with reference to FIGS. 3 and 4.

Depending on which channel is chosen as the DESIRED CHANNEL, DDFS 206 creates an appropriate sine wave to mix the desired channel down to baseband (i.e. DC). For example if the desired channel is centered at 500 MHz, DDFS 206 creates a 500 MHz sine wave for LO1 as well as a 90° shifted sine wave for LO1–90°. In an alternate embodiment LO1–270° could be used as the phase-shifted version of LO1 in which case the Q signal would be an inverted version of the Q signal as shown. Note that according to Nyquist's theorem DDFS 206 and current multiplying DACs 224 and 234 need to be clocked at greater than twice the highest frequency sine wave. Thus $F_{CLOCK}$>2*870= 1.740 GHz and is preferably 2 GHz. The operation of the various circuits at those speeds is possible using currently-available CMOS or bipolar-CMOS (BICMOS) integrated circuit manufacturing technology.

The outputs of mixers 220 and 230 include the desired channel information spectrum and all other energy is filtered by filters 226 and 236. These outputs are then further processed at baseband. Filters 226 and 236 are anti-alias lowpass filters having a cutoff frequency of about 3 MHz. The outputs of filters 226 and 236 are amplified by PGAs 228 and 238 in order to increase the amplitude of small signals and to minimize the dynamic range required of ADCs 242 and 248 in up conversion mixer 240.

In up-conversion mixer 240 the clock rate of ADCs 242 and 248 is preferably below the frequency of any received signal (i.e., 48 MHz) to minimize interference created from the switching that gets reflected back into the analog signal, but is also as high as possible to minimize the order of filters 226 and 236. For use in a television receiver having an IF center frequency of 44 MHz, a clock rate of 40 MHz was chosen. Lowpass filters 244 and 250 provide additional attenuation for undesired channels and are implemented in the digital domain. In an alternative embodiment, up conversion mixer 240 could be implemented in the analog domain and in that case ADCs 242 and 248 would not be necessary. DDFS 208 is preferably clocked at 100 MHz to satisfy the Nyquist criterion for generating a 44 MHz mixing signal.

Even though a baseband digital signal can be used by most televisions available today with simple modifications, tuner 200 preferably provides the analog IF OUTPUT at a standard IF of 44 MHz, although any other desirable IF such as 38 MHz may be used as well. Thus it is necessary for tuner 200 to re-combine the baseband I and Q signals to reconstruct the full 6 MHz spectrum in the IF signal. Up conversion mixer 240 converts the filtered, gain-adjusted I and Q signals into the digital domain using ADCs 242 and 246. Conversion of these signals into the digital domain avoids generating local oscillator signals that can creates spurs or tones, allows a relaxation of the specifications of analog filters 226 and 236, and makes it easier to extract audio signals. Up conversion mixer 240 mixes the outputs of ADCs 242 and 246 (the digital I and Q signals) to IF using digital local oscillator signals LO2 and LO2–90° before combining them in summing device 254. The output of summing device 254 is converted back to analog using IF DAC 260 and filtered in IF filter 262 for driving off-chip. In other embodiments which interface to televisions at baseband, up conversion mixer 240, DAC 260, and IF filter 262 may be omitted.

Tuner 200 uses the circuitry described in FIGS. 3 and 4 to implement an architecture that overcomes the problems associated with conventional tuners by not using oscillators to generate LO1 and LO2 and their phase-shifted variants. DDFS 206 provides an ultra pure sine wave with very low phase noise and low spur. The digitized sine wave is widely tunable and is easily generated. Since there is no circuit node that contains an actual oscillator signal, as there would be with a conventional LC oscillator, there is no mechanism for the local oscillator signals to leak or radiate into other circuits, causing unwanted locking or spurs. Another advantage of using DACs 224 and 234 is that they allow for direct down conversion to DC in the first mixer. Direct down conversion is not normally possible with an LC oscillator because leakage of the local oscillator signal to the RF INPUT causes a situation where the local oscillator mixes with itself and produces an enormous DC offset with respect to the desired signal. Generation and use of a digital local oscillator signal as required by DACs 224 and 234 eliminate this problem. The first digital local oscillator signal, LO1, mixes the center of the desired channel to DC in the current multiplying DAC by controlling the orientation of the switches. Thus tuner 200 is suitable for integration onto a single silicon chip.

It should be apparent that the local oscillator and mixer circuit described in FIGS. 3 and 4 can be used in a wide variety of RF receiver applications, including television, cellular telephones, pagers, global positioning system (GPS) receivers, cable modems, cordless phones, and the like. The transconductance amplifier and DAC may also use other transistor technologies besides CMOS. Also the type of encoding of the digital oscillator signal used within the DAC, such as binary weighted and thermometer encoded, may vary.

While an exemplary embodiment(s) has been presented in the foregoing detailed description of the invention, it should be appreciated that a vast number of variations exist. It should also be appreciated that these exemplary embodiments are only examples, and are not intended to limit the scope, applicability, or configuration of the invention in any way. Rather, the foregoing detailed description will provide those skilled in the art with a convenient road map for implementing a preferred embodiment of the invention. It being understood that various changes may be made in the function and arrangement of elements described in an exemplary preferred embodiment without departing from the spirit and scope of the invention as set forth in the appended claims.

I claim:

1. A circuit for use in a radio frequency receiver comprising:
   a transconductance amplifier having an input terminal for receiving a radio frequency signal, and an output terminal for providing a current signal;
   a direct digital frequency synthesizer having an output terminal for providing a digital local oscillator signal at a selected frequency; and
   a digital-to-analog converter having a first input terminal coupled to said output terminal of said transconductance amplifier, a second input terminal coupled to said output terminal of said direct digital frequency synthesizer, and an output terminal for providing an output signal.

2. The circuit of claim 1 wherein said radio frequency voltage signal, said current signal, and said output signal comprise differential signals.

3. The circuit of claim 2 wherein said transconductance amplifier comprises a plurality of current cells.

4. The circuit of claim 3 wherein said plurality of current cells is characterized as being binarily weighted.

5. The circuit of claim 3 wherein said plurality of current cells include a first plurality of current cells characterized as being binarily weighted and a second plurality of current cells characterized as being equally weighted.

6. The circuit of claim 3 wherein each of said plurality of current cells comprises:
   a first transistor having a first current electrode for providing a first output current signal, a control electrode for receiving a bias signal, and a second current electrode;

a second transistor having a first current electrode coupled to said second current electrode of said first transistor, a control electrode for receiving a positive radio frequency signal, and a second current electrode coupled to a power supply voltage terminal;

a third transistor having a first current electrode for providing a second output current signal, a control electrode for receiving said bias signal, and a second current electrode; and a fourth transistor having a first current electrode coupled to said second current electrode of said third transistor, a control electrode for receiving a negative radio frequency voltage signal, and a second current electrode coupled to said power supply voltage terminal.

7. The circuit of claim 6 wherein said bias signal has a magnitude that biases said first and third transistors into a linear region.

8. The circuit of claim 6 wherein said first, second, third, and fourth transistors comprise N-channel MOS transistors.

9. The circuit of claim 3 wherein said digital-to-analog converter comprises a plurality of converter cells each coupled to a corresponding one of said plurality of current cells.

10. The circuit of claim 9 wherein each of said plurality of converter cells comprises:

a first transistor having a first current electrode for providing a positive output signal, a control electrode for receiving a corresponding true bit of said digital local oscillator signal, and a second current electrode for receiving a positive current signal;

a second transistor having a first current electrode coupled to said first current electrode of said first transistor, a control electrode for receiving a corresponding complementary bit of said digital local oscillator signal, and a second current electrode for receiving a negative current signal;

a third transistor having a first current electrode for providing a negative output signal, a control electrode for receiving said corresponding complementary bit of said digital local oscillator signal, and a second current electrode for receiving said positive current signal; and a fourth transistor having a first current electrode coupled to said first current electrode of said third transistor, a control electrode for receiving said corresponding true bit of said digital local oscillator signal, and a second current electrode for receiving said negative current signal.

11. The circuit of claim 1 wherein said direct digital frequency synthesizer further has an input terminal for receiving a tuning signal corresponding to a desired channel and provides said digital local oscillator signal at a frequency corresponding to said tuning signal.

12. A mixer for use in a radio frequency tuner having a plurality of cells, each cell coupled to a first output terminal that provides an output signal of the mixer and comprising:

a current source having first and second terminals, said current source having a size proportional to an order of the cell and generating an output current proportional to a voltage applied at said second terminal;

means for modulating a voltage at said first terminal of said current source in response to a received voltage signal; and means for selectively diverting said output current between said first output terminal and a second output terminal in response to a bit of a digital local oscillator signal having an order corresponding to an order of the cell.

13. The mixer of claim 12 wherein said current source comprises an MOS transistor having a drain forming said first terminal of said current source, a gate for receiving a bias signal, and a source for providing said second terminal of said current source.

14. The mixer of claim 12 wherein said means for modulating comprises an MOS transistor having a drain coupled to said second terminal of said current source, a gate for receiving said received voltage signal, and a source coupled to a power supply voltage terminal.

15. The mixer of claim 12 wherein said means for selectively diverting comprises:

a first transistor having a first current electrode coupled to said first output terminal, a control electrode for receiving said bit, and a second current electrode coupled to said first terminal of said current source; and a second transistor having a first current electrode coupled to said second output terminal, a control electrode for receiving a complement of said bit, and a second current electrode coupled to said first terminal of said current source.

16. The mixer of claim 15 wherein said first and second transistors comprise N-channel MOS transistors.

17. The mixer of claim 12 wherein said second output terminal comprises a reference voltage terminal.

18. The mixer of claim 12 wherein said first and second output terminals together form a differential output signal of the mixer.

19. The mixer of claim 18 further comprising:

a second current source having first and second terminals, said second current source having a size proportional to said order of the cell and generating an output current proportional to a voltage applied at said second terminal;

means for modulating a voltage at said first terminal of said second current source in response to a second received voltage signal; and means for selectively diverting current between said second output terminal and said first output terminal respectively in response to said bit and a complement of said bit.

20. A method for use in a radio frequency receiver comprising the steps of:

receiving a radio frequency signal;

converting said radio frequency signal into a current signal;

generating a digital local oscillator signal; and mixing said current signal with said digital local oscillator signal to form an analog output signal.

21. The method of claim 20 wherein said step of receiving comprises the step of receiving a tuned television signal.

22. The method of claim 21 wherein said step of generating said digital local oscillator signal further comprises the step of generating said digital local oscillator signal having a frequency chosen to mix said a desired channel in said current signal to baseband.

23. A method for use in a radio frequency receiver comprising the steps of:

receiving a radio frequency signal;

converting said radio frequency voltage signal into a current signal having a plurality of currents;

generating a digital local oscillator signal having a predetermined number of bits each corresponding to one of said plurality of currents; and switching each of said plurality of currents selectively based on a logic state of a corresponding bit of said digital local oscillator signal to form an analog output signal.

24. The method of claim 23 wherein said step of switching further comprises the step of switching each of said plurality of currents to either a positive output terminal or to a negative output terminal based on said logic state of said corresponding bit of said digital local oscillator signal to form said analog output signal as a differential signal.

25. The method of claim 23 wherein said step of converting comprises the step of converting said radio frequency signal into said current signal using a transconductance amplifier.

26. The method of claim 23 wherein said step of generating said digital local oscillator signal comprises the step of generating said digital local oscillator signal in a direct digital frequency synthesizer.

* * * * *